United States Patent [19]

Andrei-Alexandru et al.

[11] Patent Number: 5,600,100

[45] Date of Patent: Feb. 4, 1997

[54] ELECTRICAL DEVICE, IN PARTICULAR STEERING COLUMN SWITCH FOR AUTOMOTIVE VEHICLES

[75] Inventors: Marcel Andrei-Alexandru, Bietigheim-Bissingen; Peter Fein, Wildberg; John M. Longney, Sachsenheim, all of Germany

[73] Assignee: ITT Automotive Europe GmbH, Germany

[21] Appl. No.: 244,393

[22] PCT Filed: Nov. 10, 1992

[86] PCT No.: PCT/EP92/02575

§ 371 Date: Aug. 15, 1994

§ 102(e) Date: Aug. 15, 1994

[87] PCT Pub. No.: WO93/10544

PCT Pub. Date: May 27, 1993

[30] Foreign Application Priority Data

Nov. 15, 1991 [DE] Germany .......................... 41 37 654.4

[51] Int. Cl.$^6$ .................................................. H05K 1/00
[52] U.S. Cl. ........................ 174/261; 439/65; 174/255; 174/254; 29/847; 29/830; 180/90
[58] Field of Search .................................. 174/250, 261, 174/255, 254; 439/65, 78, 55, 67, 77; 180/90; 29/830, 851, 847, 829; 361/749

[56] References Cited

U.S. PATENT DOCUMENTS

| | | | |
|---|---|---|---|
| 3,317,652 | 5/1967 | Johannessen et al. | 174/68.5 |
| 4,104,705 | 8/1978 | Levand, Jr. et al. | 362/5 |
| 4,764,645 | 8/1988 | Takasawa | 200/16 F |
| 4,859,806 | 8/1989 | Smith | 174/68.5 |
| 4,965,933 | 10/1990 | Mraz et al. | 29/882 |
| 5,038,468 | 8/1991 | Wanatowicz | 29/882 |
| 5,357,051 | 10/1994 | Hwang | 174/33 |
| 5,434,365 | 7/1995 | Mori et al. | 174/262 |
| 5,495,076 | 2/1996 | Davis | 174/254 |

FOREIGN PATENT DOCUMENTS

| | | | |
|---|---|---|---|
| 3515911 | 11/1986 | Germany | H01H 9/02 |
| 3717743 | 12/1988 | Germany | H05K 3/20 |

Primary Examiner—Laura Thomas
Attorney, Agent, or Firm—Thomas N. Twomey; J. Gordon Lewis

[57] ABSTRACT

An electrical device with a punched plate embedded in a plastic plate is described. The punched-out conductive contact elements are still interconnected prior to the embedding operation for ease of manipulation of the plate. The link of the conductive contact elements is a U-shaped tab which, prior to the embedding operation, stands roughly perpendicular on the conductive contact elements and is cut after the manufacture of the plastic plate. This cutting operation of the conductive contact elements is possible without holes in the plastic plate.

21 Claims, 2 Drawing Sheets

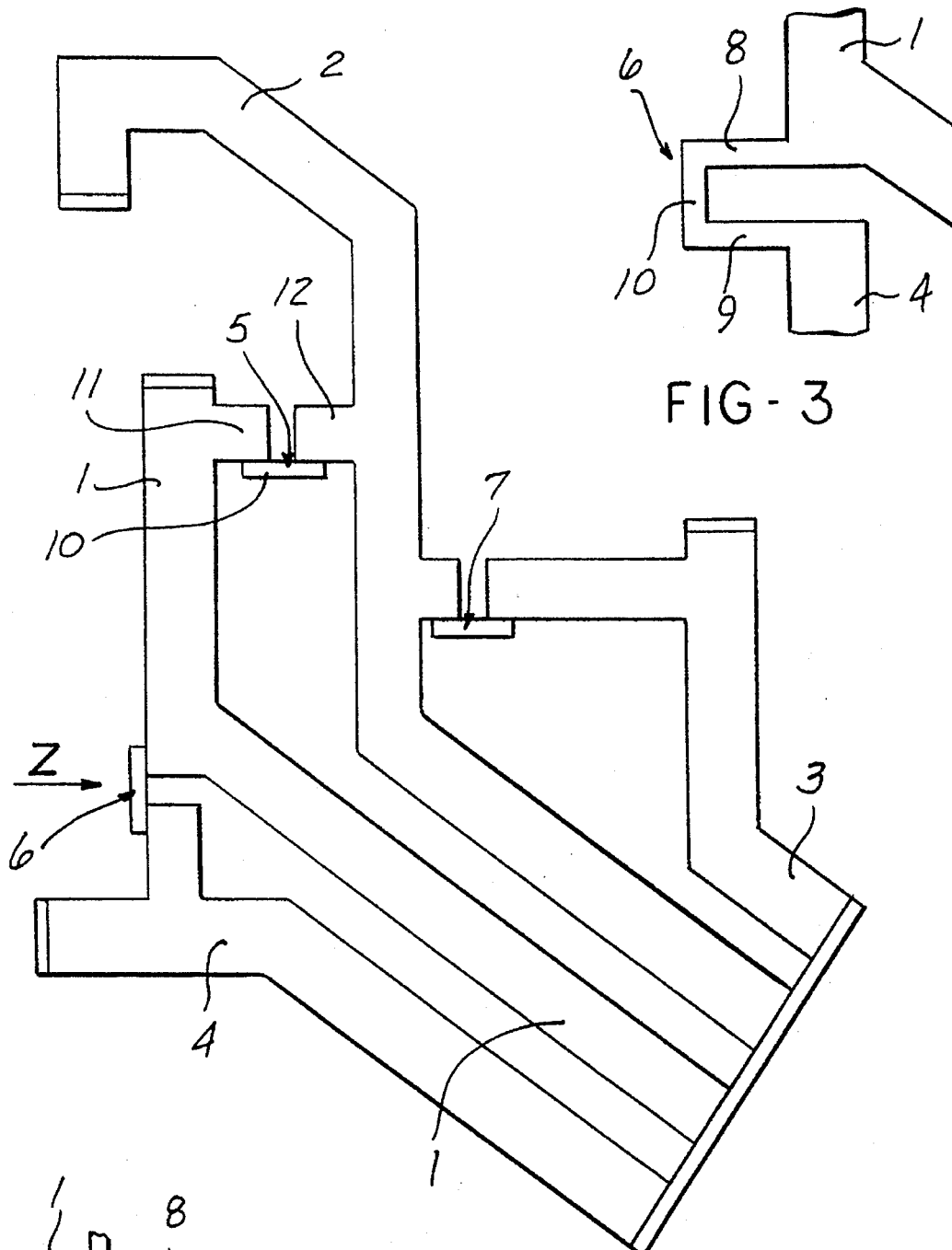
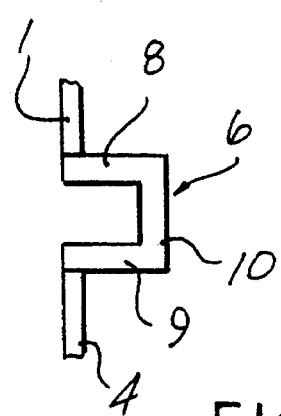
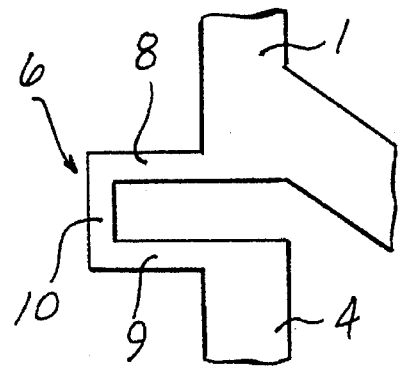

ELECTRICAL DEVICE, IN PARTICULAR STEERING COLUMN SWITCH FOR AUTOMOTIVE VEHICLES

FIELD OF THE INVENTION

The present invention relates to an electrical device, in particular, a steering column switch for automotive vehicles.

BACKGROUND OF THE INVENTION

Electrical devices, in particular steering column switches for automotive vehicles with a punched plate embedded in a plastic plate are disclosed in DE-OS 35 15 911 or DE-OS 37 17 743, for example. The punched plate which is fitted to the steering column switch is arranged in a plastic plate. The conductive contact elements of the punched plate are punched out such that they are still interconnected by small webs. In this condition, the punched plate is inserted into an injection mold, is cast in plastics and removed again from the injection mold. The webs interconnecting the single conductive contact elements are cut subsequently. The cutting operation can be performed prior to or after the insertion of the resulting plastic plate into the steering column switch. It is disadvantageous in this embodiment of the plate that those points where the individual conductive contact elements are isolated from each other, or the webs are cut, are open to the outside. Dust, small particles or even large particles or liquids may enter the electrical device at these points. These contaminants will frequently impair the function of the entire switch which is a shortcoming.

SUMMARY OF THE INVENTION

The object of the present invention is to improve upon the generic electrical device to such effect that the function is not impaired by contaminants collecting in the punched plate or the plastic housing.

This object is achieved by an electrical device, in particular, a steering column switch for automotive vehicles having a punched plate with at least two conductive contact elements embedded into a plastic plate. The conductive contact elements of the punched-out punched plate are still interconnected and the connection of the conductive contact elements is effected by a U-shaped tab, which, prior to the embedding operation, is open towards the conductive contact elements and is disposed roughly parallel to them, and which includes two legs and a transverse web, from which tab after embedding the punched plate into the plastics material of the plastic plate at least the transverse web is cut.

Providing the punched plate such that the connection of the conductive contact elements is effected by U-shaped tabs which are disposed roughly perpendicular to these, from which tabs, after the embedding into the plastics material of the plastic plate, at least the transverse web is cut off, results in that the plastic plate has no more holes through which contaminants can enter into the device. However, the stability of the punched plate is ensured nevertheless by these transverse links between the individual conductive contact elements prior to the embedding operation. Due to the connection between the conductive contact elements being provided by a U-shaped tab, the punching operation is not much more complicated than in a web-type connection. First, the tab is punched out in one plane with the conductive contact elements. Subsequently, it is bent to assume a position where it stands roughly perpendicular to the conductive contact elements. After the embedding operation, the part of the tab which projects from the surface of the plastic plate and is embedded in the plastics, preferably, is cut from the surface of the plate, being flush therewith. This way, the dimensions of the entire plastic plate are not increased.

According to a favorable embodiment, the U-shaped tab includes two parallel legs which are bent roughly perpendicularly from the conductive contact elements and are connected with these, and which are interconnected by a transverse web at their ends not connected to the conductive contact elements. This embodiment results in that, first of all, the punching operation of such a connection between two conductive contact elements is simple and, secondly, the stability of the entire punched plate is enhanced by the transverse-web connection of the two U-legs. Further, it is achieved by filling the space between the parallel legs of the U-shaped tab during the embedding operation with the plastics material that, on cutting the embedded part of the tab which projects from the surface of the plastic plate, the conductive contact elements are isolated from one another, although there is no hole in the entire plastic plate.

BRIEF DESCRIPTION OF THE DRAWINGS

The present invention is explained in more detail by way of two embodiments with reference to the accompanying drawings. In the drawings:

FIG. 1 is a punched plate which is not embedded;

FIG. 2 is a view in the direction of the arrow Z in FIG. 1;

FIG. 3 is a view of an U-shaped tab according to FIG. 1 in the punched-out condition, not yet angled off;

DESCRIPTION OF THE PREFERRED AND ALTERNATIVE EMBODIMENTS

Figure 4:
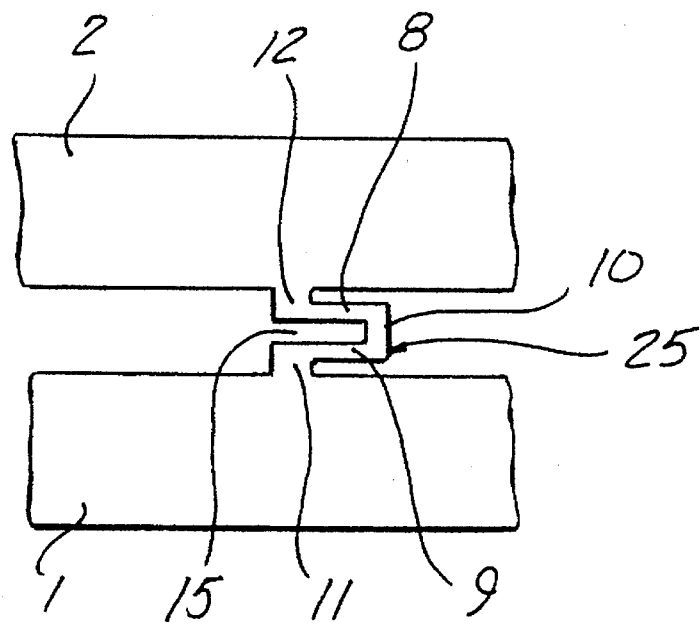
FIG. 4 is a view of an U-shaped tab of a second embodiment in the punched-out condition, not yet angled off.

The punched plate according to FIGS. 1 to 3 includes conductive contact elements 1, 2, 3 and 4. The connection between the conductive contact elements 1 and 2 is provided by the U-shaped tab 5, while the connection between the conductive contact elements 4 and 1 is provided by the U-shaped tab 6, and the connection between the conductive contact elements 2 and 3 is provided by the U-shaped tab 7. In the illustrations according to FIGS. 1 and 2, the U-shaped tabs 5, 6, 7 after the punching operation are already angled off from the conductive contact elements 1, 2, 3, 4, approximately perpendicular to them. Each of the U-shaped tabs 5, 6 and 7 comprises two legs 8 and 9 extending parallel to one another, each of them at one end being connected with a lateral edge of a conductive contact element. At the other end, the legs 8 and 9 are interconnected by a transverse web 10 to a U-shaped configuration. The lateral edge of the one conductive contact elements, from which the one leg starts, is disposed on one line with the lateral edge of the conductive contact element, from which the other leg starts. As a result, the two legs 8 and 9 of each tab 5, 6 and 7 lie on the same side of the two interconnected conductive contact elements. Further, the transverse web 10 extends in parallel to the two lateral edges. As can be seen in FIGS. 1 and 2, the legs 8 and 9 of the tabs 5, 6 and 7 erect by following around a bending edge which is in parallel to the two lateral edges on which they are seated, the bending edge being arranged directly at the lateral edges.

In FIG. 4, the shape of the tab of the second embodiment after the punching operation is illustrated schematically. The U-shaped tab 25 interconnects the conductive contact elements 1 and 2 at two opposed lateral edges, in between which it is disposed. The tab comprises two legs 8, 9 which extend in parallel to each other and in parallel to the conductive contact elements 1, 2 and are connected with lateral edges of the conductive contact elements 1 and 2. At their other ends, which are not connected with the conductive contact elements 1, 2, the legs 8, 9 are interconnected by a transverse web 10, which extends perpendicular to the two lateral edges. The legs 8, 9 of the U-shaped tab 25 are connected with the conductive contact elements 1, 2 through projections 11, 12, which are opposite to each other and from which the legs 8 and 9 erect by following around a bending edge which extends perpendicular to the two opposed lateral edges of the conductive contact elements 1 and 2. After the bending operation of the U-shaped tab 25, that means after the tab has been caused to adopt a roughly perpendicular position to the conductive contact elements's plane, the open end of the U-shaped tab 25 faces the conductive contact elements 1, 2. The punched plate is inserted into a mold in this condition, and plastic is injected into the mold.

Figure 5:
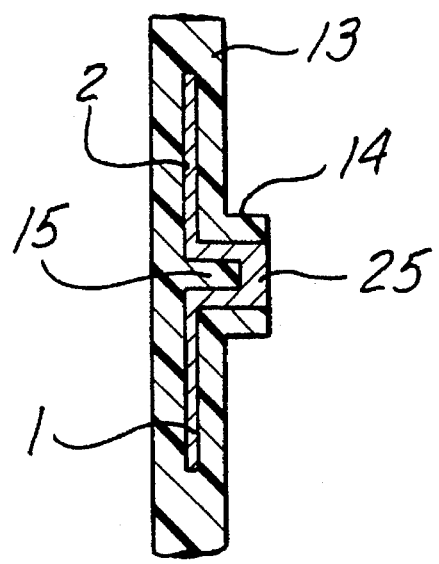
FIG. 5 is a cross-section taken through the embedded area of the U-shaped tab according to FIG. 2.
Figure 6:
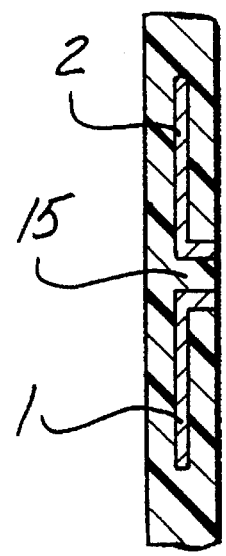
FIG. 6 is an illustration according to FIG. 5, however, with the U-shaped tab cut from the plastic housing.

FIG. 5 illustrated the condition after the injection molding operation. The conductive contact elements 1, 2 are embedded in the plastics material 13. The tab 25, too, is embedded in the plastic material 13. More particularly, the plastic material is in the space 15 between the legs 8, 9. In the next step of the manufacturing process, the part 14 which projects from the surface of the plastic plate and in which also part of the U-shaped tab 25 is embedded, is cut from the plastic plate. Such a cutting operation can be effected by milling, for instance. As can be clearly seen in FIG. 6, the conductive contact elements 1 and 2 also are isolated from each other. The plastic disposed in the space 15 isolates the two conductive contact elements 1, 2 from one another and, additionally, establishes a connection to the surface of the plastic plate. Thus, the plate does not contain any holes or recesses, it is leak-proof and has a smooth unbroken surface.

What is claimed is:

1. A method of forming an electrical device, comprising the steps of:

punching out a plate with at least two conductive contact elements, the conductive contact elements of the punched-out plate being interconnected by a U-shaped tab open towards the conductive contact elements and disposed approximately perpendicular on the conductive contact elements, and the U-shaped tab having two legs and a transverse web;

embedding the punched-out plate into plastics material of a plastic plate; and cutting at least the transverse web of the U-shaped tab after the punched-out plate is embedded into the plastic plate.

2. The method of claim 1, characterized in that the legs of the U-shaped tab stand approximately perpendicular on the conductive contact elements, are connected with the conductive contact elements at a first end and extend in parallel to one another, and in that at second ends the legs are interconnected by the transverse web.

3. The method of claim 1 characterized in that the U-shaped tab comprises a first leg connected with a first conductive contact element, a second leg connected with a second conductive contact element, and a transverse web interconnecting the two legs, and in that the tab is punched out of the plate in U-shaped configuration such that, directly after the punching operation, the legs and the transverse web of the tab lie in a common plane of the punched-out plate.

4. The method of claim 3, characterized in that the one leg of the tab is connected with a lateral edge of the first conductive contact element, and the other leg of the tab is connected with a lateral edge of the second conductive contact element, in that the two legs and the transverse web of the tab are disposed on the same side of both conductive contact elements, and the transverse web extends at least approximately in parallel to a lateral edge.

5. The method of claim 4, further comprising the step of bending the legs of the tab along a bending edge, such that the tab is disposed in an erect position extending outwardly from the common plane of the punched-out plate and the bending edge is parallel to a lateral edge.

6. The method of claim 3, characterized in that the one leg of the tab is connected with a lateral edge of the first conductive contact element, and the other leg of the tab is connected with a lateral edge of the second conductive contact element opposed to the lateral edge of the first conductive contact element, in that the two legs and the transverse web of the tab are disposed between the two lateral edges and the transverse web extends at least approximately perpendicular to a lateral edge.

7. The method of claim 6, characterized in that the two conductive contact elements have opposed lateral projections, and further comprising the step of bending the legs of the tab along a bending edge, such that the tab is disposed in an erect position extending outwardly from the common plane of the punched-out plate and the bending edge is perpendicular to a lateral edge.

8. The method of claim 1 characterized in that a space between the parallel legs of the U-shaped tab is filled by the plastics material.

9. A punched plate for an electrical device characterized in that conductive contact elements are connected by a U-shaped tab open towards the conductive contact elements and disposed approximately perpendicular on the conductive contact elements, and the U-shaped tab includes two legs and a transverse web, wherein at least the transverse web is cutable from the tab after embedding the punched plate into plastics material of a plastic plate.

10. A plastic plate for an electrical device characterized in that a punched plate includes conductive contact elements connected by a U-shaped tab open towards the conductive contact elements and disposed approximately perpendicular on the conductive contact elements, and the U-shaped tab including two legs and a transverse web, wherein after embedding the punched plate into plastics material of the plastic plate at least the transverse web of the U-shaped tab is cut.

11. An electrical device comprising:

a punched plate with at least two conductive contact elements embedded into a plastic plate, the conductive contact elements of the punched plate interconnected by a U-shaped tab prior to embedding into the plastic plate, the U-shaped tab open towards the conductive contact elements and disposed approximately perpendicular on the conductive contact elements, the U-shaped tab including two legs and a transverse web, wherein at least the transverse web of the U-shaped tab is cut after embedding the U-shaped tab and the punched plate into the plastic plate.

12. The electrical device of claim 11 further comprising:

the two legs of the U-shaped tab standing approximately perpendicular on the conductive contact elements, and connected with the conductive contact elements at one end to extend in parallel with one another, and at opposite ends interconnected by the transverse web.

13. The electrical device of claim 11 further comprising:

the two legs of the U-shaped tab defined by a first leg connected with a first conductive contact element, a second leg connected with a second conductive contact element, and the transverse web interconnecting the two legs, the tab punched out of the punched plate in U-shaped configuration such that, directly after the punching operation, the legs and the transverse web of the tab lie in a common plane with the punched plate.

14. The electrical device of claim 13 further comprising:

one leg of the tab connected with a lateral edge of the first conductive contact element, and the other leg of the tab connected with a lateral edge of the second conductive contact element, the two legs and the transverse web of the tab disposed on the same side of both conductive contact elements, and the transverse web extending at least approximately in parallel to one of the lateral edges.

15. The electrical device of claim 14 further comprising:

the two legs of the tab bent erect to a position generally perpendicular to the plane of the punch plate around a bending edge parallel to one of the lateral edges.

16. The electrical device of claim 13 further comprising:

one leg of the tab connected with a lateral edge of the first conductive contact element, and the other leg of the tab connected with a lateral edge of the second conductive contact element opposed to the lateral edge of the first conductive contact element, the two legs and the transverse web of the tab disposed between the two lateral edges, and the transverse web extending at least approximately perpendicular to one of the lateral edges.

17. The electrical device of claim 16 further comprising:

the two conductive contact elements having opposed lateral projections, the legs of the tab extending from the opposed lateral projections and bent erect around a bending edge perpendicular to one of the lateral edges.

18. The electrical device of claim 11 further comprising:

the two legs of the U-shaped tab parallel to one another and defining a space therebetween, the space filled by plastic material when the punched plate is embedded into the plastic plate.

19. An electrical device formed according to the method of claim 1 comprising:

the punched plate with at least two conductive contact elements embedded into the plastic plate, the conductive contact elements of the punched plate interconnected by the U-shaped tab prior to embedding into the plastic plate, the U-shaped tab open towards the conductive contact elements and disposed approximately perpendicular on the conductive contact elements, the U-shaped tab including two legs and the transverse web, wherein at least the transverse web of the U-shaped tab is cut after embedding the U-shaped tab and the punched plate into the plastic plate.

20. The electrical device of claim 11 formed according to the steps of:

punching out the plate with at least two conductive contact elements, the conductive contact elements of the punched-out plate being interconnected by the U-shaped tab open towards the conductive contact elements and disposed approximately perpendicular on the conductive contact elements, and the U-shaped tab having two legs and the transverse web;

embedding the punched-out plate into plastics material of the plastic plate; and cutting at least the transverse web of the U-shaped tab after the punched-out plate is embedded into the plastic plate.

21. An electrical device comprising:

a punched plate with at least two conductive contact elements defining a common plane;

a tab interconnecting the conductive contact elements of the punched plate, the tab having first and second legs with a transverse web bridging a gap defined between the first and second legs, such that the tab is bendable out of the common plane; and a plastic plate having the punched plate embedded therein, wherein at least the transverse web of the bent tab is cut after embedment of the punched plate in the plastic plate.

* * * * *